(12) United States Patent
Aubauer et al.

(10) Patent No.: US 10,873,330 B2
(45) Date of Patent: Dec. 22, 2020

(54) ELECTRODE DESIGN FOR ELECTRIC FIELD MEASUREMENT SYSTEM

(71) Applicant: Microchip Technology Germany GmbH II & CO. KG, Ismaning (DE)

(72) Inventors: Roland Aubauer, Wessling (DE); Claus Kaltner, Unterbachern/Bergkirchen (DE)

(73) Assignee: MICROCHIP TECHNOLOGY GERMANY GMBH II & CO. KG, Ismaning (DE)

( * ) Notice: Subject to any disclaimer, the term of this patent is extended or adjusted under 35 U.S.C. 154(b) by 390 days.

(21) Appl. No.: 15/209,321

(22) Filed: Jul. 13, 2016

(65) Prior Publication Data

US 2016/0322971 A1    Nov. 3, 2016

Related U.S. Application Data

(63) Continuation of application No. 14/055,989, filed on Oct. 17, 2013, now Pat. No. 9,459,296.
(Continued)

(51) Int. Cl.
*H03K 17/96* (2006.01)
*G01R 27/26* (2006.01)

(52) U.S. Cl.
CPC ....... *H03K 17/962* (2013.01); *G01R 27/2605* (2013.01); *H03K 2017/9602* (2013.01); *H03K 2217/960755* (2013.01)

(58) Field of Classification Search
CPC ....... G01R 27/2605; H03K 2017/9602; H03K 2217/960755
See application file for complete search history.

(56) References Cited

U.S. PATENT DOCUMENTS 5,315,232 A * 5/1994 Stewart ................. G01R 29/12
324/457
8,243,027 B2 8/2012 Hotelling et al. ........... 345/173
(Continued)

FOREIGN PATENT DOCUMENTS

CN    101807571 A    8/2010  ............ G06F 17/50
CN    102053751 A    5/2011  ............ G06F 3/041
(Continued)

OTHER PUBLICATIONS

International Search Report and Written Opinion, Application No. PCT/EP2013/071905, 11 pages, dated Mar. 4, 2014.
(Continued)

*Primary Examiner* — Son T Le
*Assistant Examiner* — Adam S Clarke
(74) *Attorney, Agent, or Firm* — Slayden Grubert Beard PLLC

(57) ABSTRACT

An electrode arrangement for an electric field sensor device with a transmitting electrode and at least one receiving electrode may have a nonconductive substrate having a first conductive layer and a second conductive layer. A first electrode is arranged within the first conductive layer, wherein the first electrode is a receiving electrode of the electric field sensor device, and a second electrode is arranged within the second conductive layer, wherein the second electrode is a transmitting electrode of the electric field sensor device wherein the second electrode covers a larger area than the first electrode and wherein the second electrode is textured to reduce the capacitance between the first and second electrode.

22 Claims, 9 Drawing Sheets

Related U.S. Application Data

(60) Provisional application No. 61/715,966, filed on Oct. 19, 2012.

(56) References Cited

U.S. PATENT DOCUMENTS

| | | | |
|---|---|---|---|
| 8,803,823 B2 | 8/2014 | Chang et al. | 345/173 |
| 9,551,904 B2 | 1/2017 | Philipp | 345/173 |
| 2008/0062148 A1 | 3/2008 | Hotelling et al. | 345/174 |
| 2008/0122798 A1 | 5/2008 | Koshiyama et al. | 345/173 |
| 2009/0002337 A1 | 1/2009 | Chang | 345/174 |
| 2009/0107737 A1* | 4/2009 | Reynolds | G01R 27/2605 178/18.06 |
| 2010/0207242 A1 | 8/2010 | Izuha et al. | 257/532 |
| 2010/0253319 A1* | 10/2010 | Cehelnik | G06F 3/017 324/72 |
| 2010/0292945 A1 | 11/2010 | Reynolds et al. | 702/65 |
| 2011/0053357 A1 | 3/2011 | Yamazaki | 438/488 |
| 2011/0156930 A1 | 6/2011 | Chen et al. | 341/33 |
| 2011/0187676 A1 | 8/2011 | Chang et al. | 345/174 |
| 2012/0044198 A1 | 2/2012 | Chai et al. | 345/174 |
| 2012/0229417 A1 | 9/2012 | Badaye | 345/174 |
| 2012/0262391 A1 | 10/2012 | Maki et al. | 345/173 |
| 2013/0120052 A1* | 5/2013 | Siska | H03K 17/962 327/517 |
| 2013/0181911 A1* | 7/2013 | Yilmaz | G06F 3/044 345/173 |
| 2013/0194519 A1 | 8/2013 | Ivanov | 349/12 |
| 2014/0111222 A1 | 4/2014 | Aubauer et al. | 324/658 |
| 2014/0240285 A1 | 8/2014 | Hermes | 345/174 |
| 2014/0267137 A1 | 9/2014 | Solven et al. | 345/174 |
| 2014/0267155 A1 | 9/2014 | Aubauer et al. | 345/174 |
| 2014/0267157 A1* | 9/2014 | Dorfner | H03K 17/955 345/174 |

FOREIGN PATENT DOCUMENTS

| | | | |
|---|---|---|---|
| GB | 2435998 A | 9/2007 | G01D 5/24 |
| JP | 09274093 A | 10/1997 | G21C 15/02 |
| JP | 2012068724 | 4/2012 | G06F 3/02 |
| TW | 200901014 A | 1/2009 | G06F 3/041 |
| WO | 2011/098281 A2 | 8/2011 | G06F 3/01 |
| WO | 2011/128116 A2 | 10/2011 | G06F 3/044 |

OTHER PUBLICATIONS

Taiwan Office Action, Application No. 102137797, 6 pages, dated Feb. 24, 2017.
Chinese Office Action, Application No. 201380063805.4, 13 pages, dated Feb. 24, 2017.
Japanese Office Action, Application No. 2015537283, 7 pages, dated Jun. 27, 2017.
Chinese Office Action, Application No. 201380063805.4, 5 pages, dated Feb. 8, 2018.
European Office Action, Application No. 13779818.7, 7 pages, dated Apr. 12, 2018.
Chinese Office Action, Application No. 201380063805.4, 15 pages, dated Jul. 31, 2017.
Japanese Office Action, Application No. 2018-021632, 12 pages, dated Dec. 21, 2018.
European Office Action, Application No. 13779818.7, 10 pages, dated Oct. 15, 2019.

* cited by examiner

ELECTRODE DESIGN FOR ELECTRIC FIELD MEASUREMENT SYSTEM

CROSS-REFERENCE TO RELATED APPLICATIONS

This application is a Continuation of U.S. application Ser. No. 14/055,989 filed on Oct. 17, 2013, which claims the benefit of U.S. Provisional Application No. 61/715,966 filed on Oct. 19, 2012, which are incorporated herein in its entirety.

TECHNICAL FIELD

The present disclosure relates to electrodes, in particular the design of an electrode for use in an electric field measurement system.

BACKGROUND

Human device interfaces in particular for mobile devices often use sensors arrangements for detecting an user input that do not necessarily require any movable parts. Examples are touch screens and capacitive switches that are required to be touched to be activated. Such sensor systems comprise electrodes that are arranged on the device wherein if a user touches them or gets into very close proximity a change in capacitance can be measured to trigger an event. These electrodes are often formed by small metal plates, etched areas on a circuit board, or areas in a metal layer such as a transparent TIN oxide layer for use in displays.

Similar electrodes can also be used for electric field measurement. This type of sensor device allows detection of an object without touching and at far greater distances from the device as conventional capacitive sensor systems. In an electric field measurement system, an electrode is used as a transmitter to project an electric field outside or in front of a respective device. The field may be generated by a 30-200 kHz, in particular a 70-140 kHz or a 40-115 kHz, signal and thus is quasi-static in the near field. Whenever an object enters such an quasi-static electric field, its parameters are influenced or changed. The same electrode or a separate receiver electrode can be used to detect these changes. If a plurality of such electrodes are used in a sensing system, multi-dimensional gesture detection becomes possible which allows operation of the device without touching it. In electric field sensing arrangements the sensors often need to be shielded or arranged in specific order and then may be coupled to a front end integrated circuit device for evaluation of incoming signals.

SUMMARY

Sensitivity of electrodes used in a system that generates a quasi-static electric field and sense disturbances in that field when an object enters the field is often low, in particular in a system that uses solid electrodes. Hence, there exists a need for improved electrodes and electrode arrangements.

According to an embodiment, an electrode arrangement for an electric field sensor device generating a quasi-static electric field with at least one transmitting electrode and at least one receiving electrode, comprising a nonconductive substrate having a first conductive layer and a second conductive layer, a first electrode arranged within the first conductive layer, wherein the first electrode is a receiving electrode of the electric field sensor device, and a second electrode arranged within the second conductive layer, wherein the second electrode is a transmitting electrode of the electric field sensor device wherein the second electrode covers a larger area than the first electrode and wherein the first and/or second electrode is textured to reduce the capacitance between the first and second electrode.

According to a further embodiment, only the second electrode can be textured such that it comprises at least one cut-out area having a similar form of the first electrode and being located under the first electrode such that the first electrode covers the cut-out area. According to a further embodiment, the entire area of the second electrode can be textured by a hash or hatch texture. According to a further embodiment, the texture can be formed by a plurality of conductive lines. According to a further embodiment, the hash or hatch texture can be homogenous. According to a further embodiment, the hash or hatch texture can be formed by a plurality of conductive lines forming a mesh. According to a further embodiment, the mesh can be formed by a first set of parallel arranged conductive lines and a second set of parallel arranged conductive lines. According to a further embodiment, the first set of parallel arranged conductive lines may cross said second set of parallel arranged conductive lines at an angle of 90 degrees. According to a further embodiment, the mesh may comprise a peripheral conductive line enclosing the mesh. According to a further embodiment, the second electrode can be textured to provide a plurality of grooves. According to a further embodiment, the grooves can be arranged in parallel at predefined distances. According to a further embodiment, only the first electrode is textured. According to a further embodiment, the electrode arrangement may further comprise a plurality of first electrodes arranged above said second electrode and a plurality of feeding lines for electrical connection to said second electrodes. According to a further embodiment, at least one set of four first electrodes can be arranged to define a rectangular area. According to a further embodiment, the electrode arrangement may further comprise a center electrode within the rectangular area defined by the four electrodes. According to a further embodiment, the second electrode can be textured as a mesh electrode and only covers the rectangular area defined by the at least one set of four first electrodes. According to a further embodiment, the feeding lines may have a width of about 0.15 mm. According to a further embodiment, the first conductive layer can be a top layer of a printed circuit board. According to a further embodiment, the second conductive layer can be a bottom layer of a printed circuit board. According to a further embodiment, the first conductive layer can be a transparent conductive top layer on a transparent isolating carrier material. According to a further embodiment, the second conductive layer can be a bottom layer on the transparent isolating carrier material. According to a further embodiment, the feeding lines and said second electrode can be arranged within an inner layer of a multi-layer printed circuit board. According to a further embodiment, a bottom layer of the multi-layer printed circuit board can be connected to ground. According to a further embodiment, the electrode arrangement may further comprise a front end analog device coupled with said receiving electrodes through said feeding lines. According to a further embodiment, the front end analog device may comprise a voltage divider for attenuating a signal received through said feeding lines. According to a further embodiment, the voltage divider may comprise a frequency compensation. According to a further embodiment, the electrode arrangement may comprise a plurality of second electrodes electrically insulated from each other each forming a partial transmission electrode. According to a further embodiment, each transmission electrode can be formed by a rectangular electrode section.

DETAILED DESCRIPTION

According to various embodiments, electrode design, in particular for use with an integrated front end device can be improved enabling significant higher sensitivity to the object to be tracked, for example a user's hand.

Figure 1:
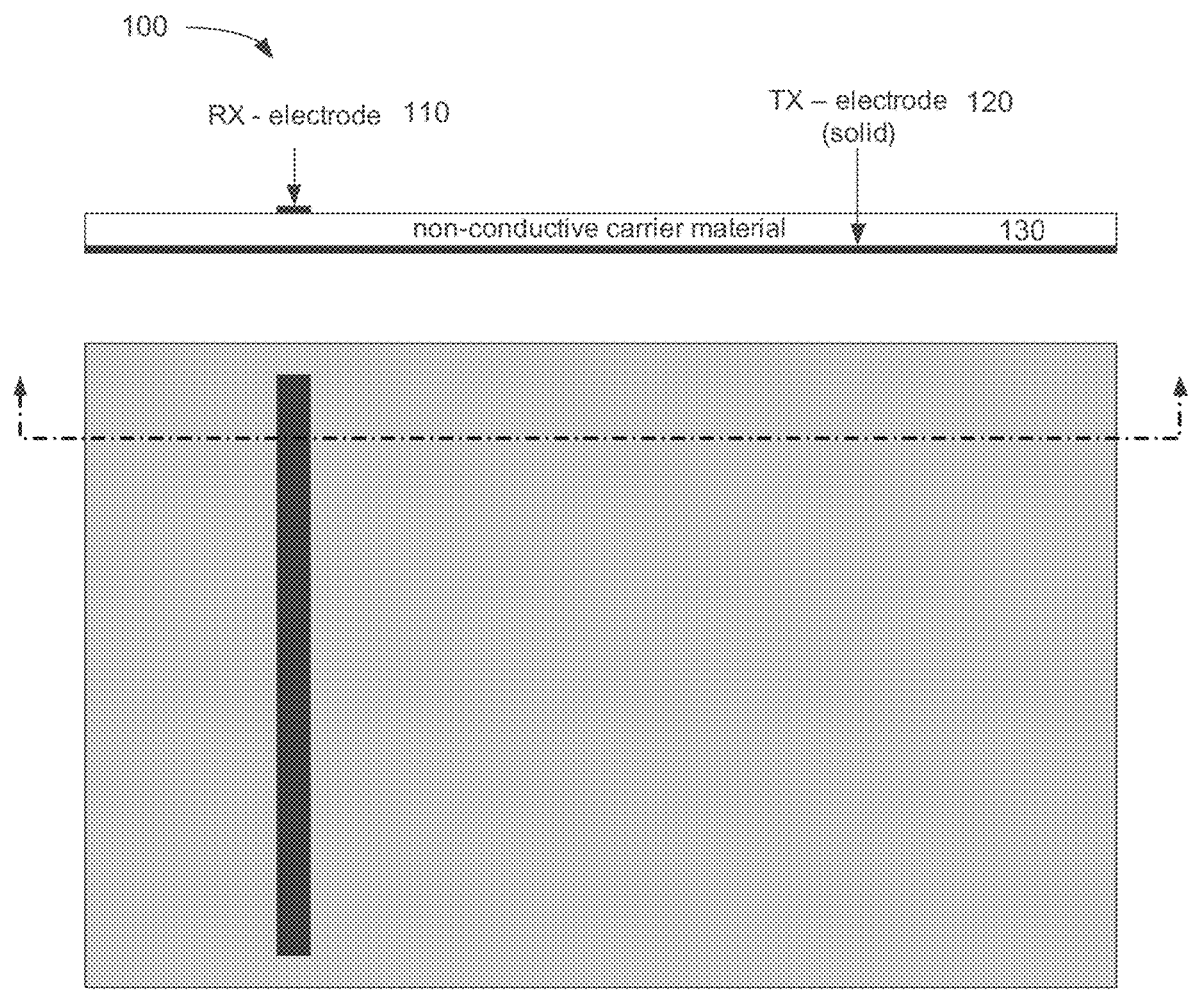
FIG. 1 shows a solid transmission (Tx) electrode on the bottom layer and receiving (Rx) electrode on the top layer of a dielectric substrate.

FIG. 1 shows a conventional layout 100 of a transmission electrode 120 and a single reception electrode 110 for a quasi-static electric field sensor system. More or less transmitting and receiving electrodes may be used but for clarity purposes only one transmitting electrode is shown in FIG. 1. Also, in this embodiment only a single reception electrode 110 arranged on a top layer of a dielectric carrier substrate 130 is shown. However, a plurality of separate reception electrodes 110 may be arranged on the top layer of dielectric carrier substrate 130. The transmission electrode 120 is arranged on the bottom layer of dielectric carrier substrate 130. This arrangement causes a capacitive link between the transmission and reception electrode.

In operation, the transmission electrode will be fed with an alternating signal, for example a square wave signal generated by a microcontroller having a frequency of about 30-200 kHz, in particular about 70-140 kHz or 40-115 kHz. Other suitable frequency ranges may apply. This generates a quasi-static electric field above and below the transmission electrode plane. In most applications only the field generated away from the transmission electrode 120 in direction of the receiving electrode 110 is of interest. Once an object, such as a hand of a user having a hand capacitance $C_{Hand}$, enters this quasi-static electric field, a signal at the receiving electrode will change due to capacitive influences caused by the object. Such disturbances vary with the distance of the object to the electrodes. A front end circuit can detect such signal changes and further evaluate or process these signals.

The signal sensitivity of such a front-end integrated circuit system as will be explained in more detail below is:

$$dS \approx V_{Tx} \cdot a[C_{Hand}/(C_{RxTx}+C_L+2(C_N+C_{RxG}+a \cdot C_{Buf})+(C_N+C_{RxG}+a \cdot C_{Buf})^2/(C_{RxTx}+C_L))]$$

where dS is approximately a linear function of the hand capacitance $C_{Hand}$. $C_{RxTx}$ is the capacitance between the transmission and reception electrode. $C_{Buf}$ is the input capacitance of the input buffer of the front-end integrated circuit device. $C_L$ is the capacitance created between the Rx feeding line and the Tx electrode. $C_N$ is the noise coupling capacitance. $C_{RxG}$ is the capacitance between Rx electrode and ground. Parameter 'a' is an attenuation factor determined by the voltage divider used in the input circuit.

The above equation show that the sensitivity to the hand increases when the denominator is minimized. In an application, the following parameter are influencing factors:

(a) the Rx feeding line capacitance $C_L$
(b) the Rx electrode ground capacitance $C_{RxG}$ and
(c) the capacitance between the Rx and the Tx electrode $C_{RxTx}$ A first solution for factor (a) can be achieved by maximizing the distance of the Rx feeding lines to the Tx electrode and its feeding lines. Nevertheless, this is a tradeoff between shielding the Rx feeding line from hand influences which is recommended. According to various embodiments, the above equation shows that it is better to shield the Rx feeding line with a Tx signal instead of ground. Ground shielding would increase $C_{RxG}$ which has a more negative impact on the system sensitivity than $C_L$. It is always good to make the Rx feeding lines as thin as possible. This minimizes both the feeding line capacitance to Tx and to ground as well as the influence of the hand to the feeding line.

A second solution for factor (a) can be achieved when using an active guard/shield around the Rx feeding line, where the guard/shield is driven actively by the received and buffered input signal. In ideal this guard would be a coax cable which completely encloses the feeding line. Other less optimum designs are shielding from the top and/or from both sides.

A solution for factor (b) can be achieved in general by maximizing the distance between the Rx-Tx electrode stack up and ground. Since ground parts typically cover large areas in an integrated front-end system e-field stray effects dominate typically $C_{RxG}$ and it often doesn't make sense to increase the Rx electrode distance to ground to more than a few millimeters.

A first solution for factor (c) can be achieved by increasing the distance between the Rx and the Tx electrode. In a good quasi-static alternating near field electrode design $C_{RxTx}$ dominates the other capacitances in above equation. Thus, it is desirable to optimize $C_{RxTx}$ by other ways than just increasing the distance between the Rx and Tx electrode since very thin electrodes designs are desirable for most consumer electronic devices which are driven by ultrathin device designs. Many of these designs may use a main printed circuit board with the substrate serving as the non-conductive carrier material as, for example, shown in FIG. 1.

According to various embodiments, the capacitance between the Rx and the Tx electrode can be decreased while the useful capacitance $C_{Hand}$ between Rx and the hand kept in the same order of magnitude. Since in a typical integrated front-end design a smaller Rx receive electrode 110 is placed on top of the larger transmitting Tx electrode 120 the Rx-Tx capacitance can assumed to be the plate capacitance of the face to face areas of the Rx and Tx superimposed with the capacitance created from the stray e-field from the Rx electrode 110 to the much larger Tx electrode 120 as shown in FIG. 1. The plate capacitance is defined as $C=\varepsilon_0 \cdot \varepsilon_r \cdot A/d$.

The target object (e.g., a users hand) influences in this model only the stray field but not the plate capacitance between the face-to-face areas of Rx and Tx. Thus, according to various embodiments, the plate capacitance versus the Rx-Tx stray capacitance is minimized and by this the influence of the hand to the stray field is maximized. This can be achieved by cutout 240 (leave open) of the Tx electrode 210 underneath the Rx electrode 220 as shown, e.g., with electrode arrangement 200 in FIG. 2. Here, again a substrate 230 such as a printed circuit board or any other suitable carrier provides on one side for the transmitting electrode 220 and on the other side for the receiving electrode 210. The cut-out area 240 does not need to exactly match the size of the Rx electrode 220. As will be shown below with FIG. 10, the cut-out area can also be larger, for example extend to cover an entire exterior area when four Rx electrodes are arranged to define a rectangular sensing area.

The above equation of the signal sensitivity shows furthermore an optimum signal sensitivity is yield for a given capacity between the Rx input and ground $(C_N+C_{RxG}+a\cdot C_{Buf})$ when $(C_{RxTx}+C_L)$ equals $(C_N+C_{RxG}+a\cdot C_{Buf})$.

Figure 3:
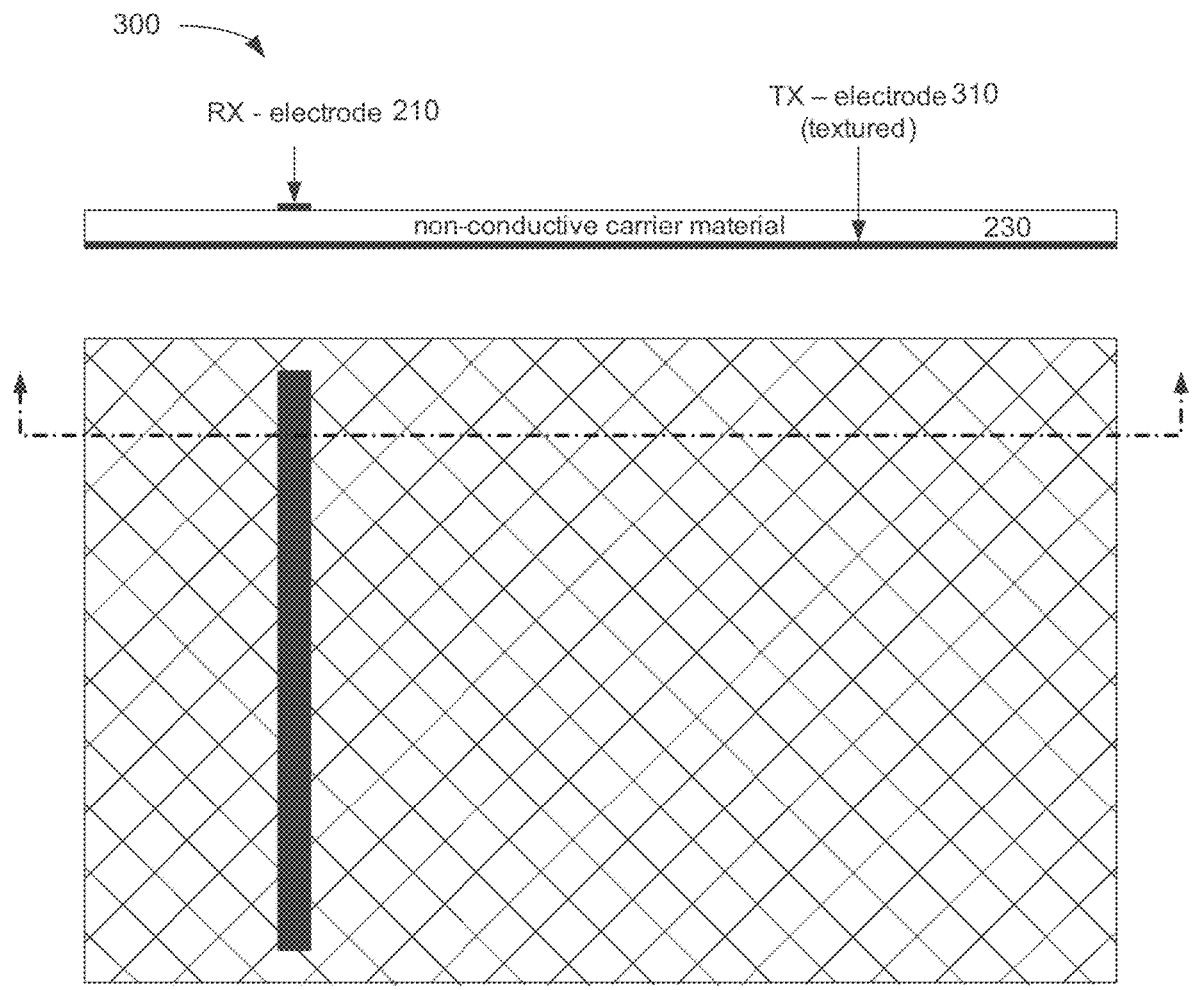
FIG. 3 shows a textured Tx electrode according to an embodiment.
Figure 4:
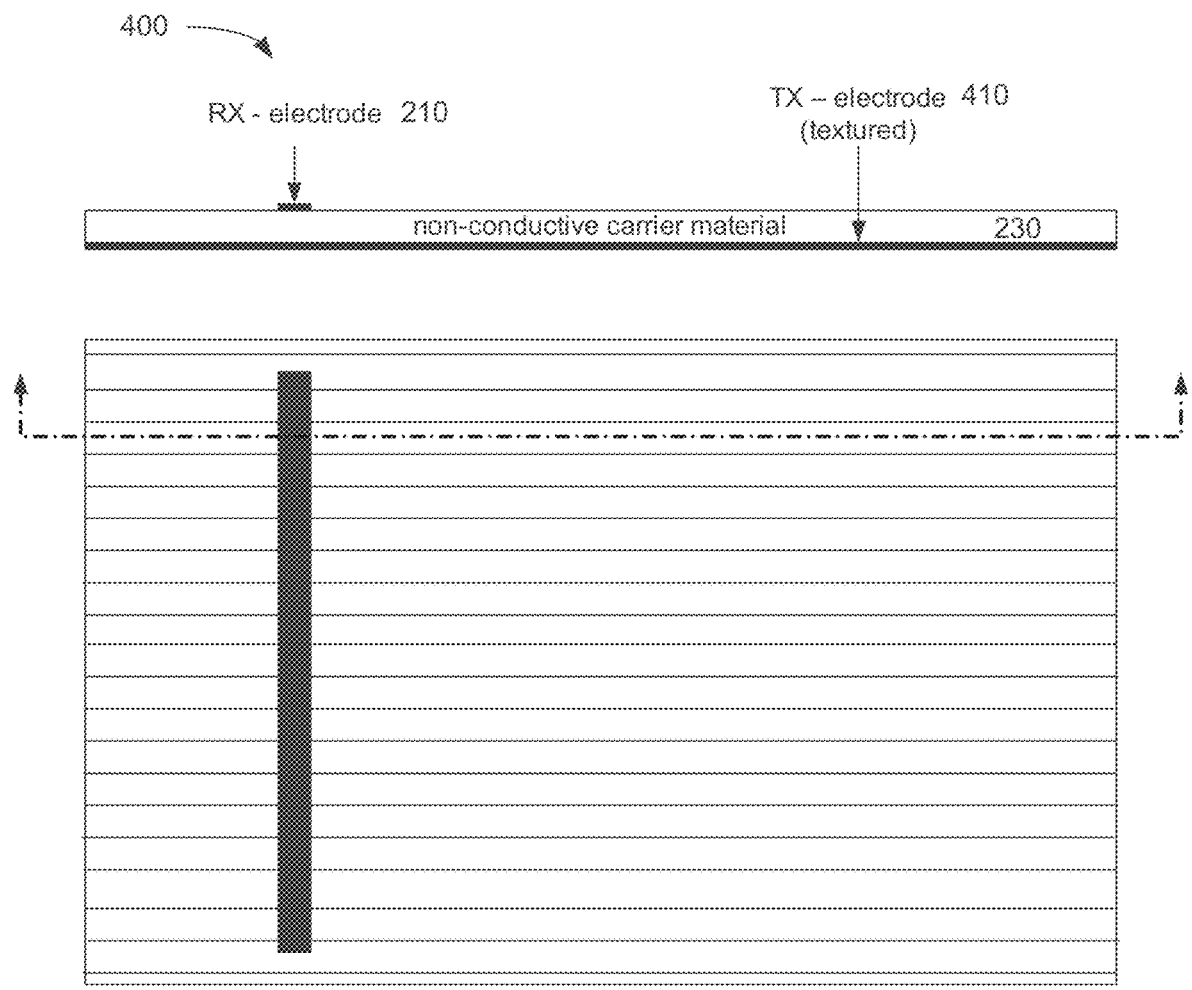
FIG. 4 shows a textured Tx electrode according to another embodiment.

For an integrated front end circuit design the Rx electrode 210 is typically shielded by the Tx electrode 220 from the (device) ground. Therefore $C_{RxG}$ is typically smaller than the $C_{RxTx}$ capacitance. $C_N$ and $C_{Buf}$ are very low anyhow as will be discussed below in more detail. A proposed solution of an arrangement 300 as shown in FIG. 3 is to hash/texture the Tx electrode surface 310 in order to reduce the (plate) capacitance between Rx and Tx. FIGS. 3 and 4 show different embodiments 300 and 400 wherein the transmitting electrode is differently textured in each case. Thus, different structures are possible.

Figure 10:
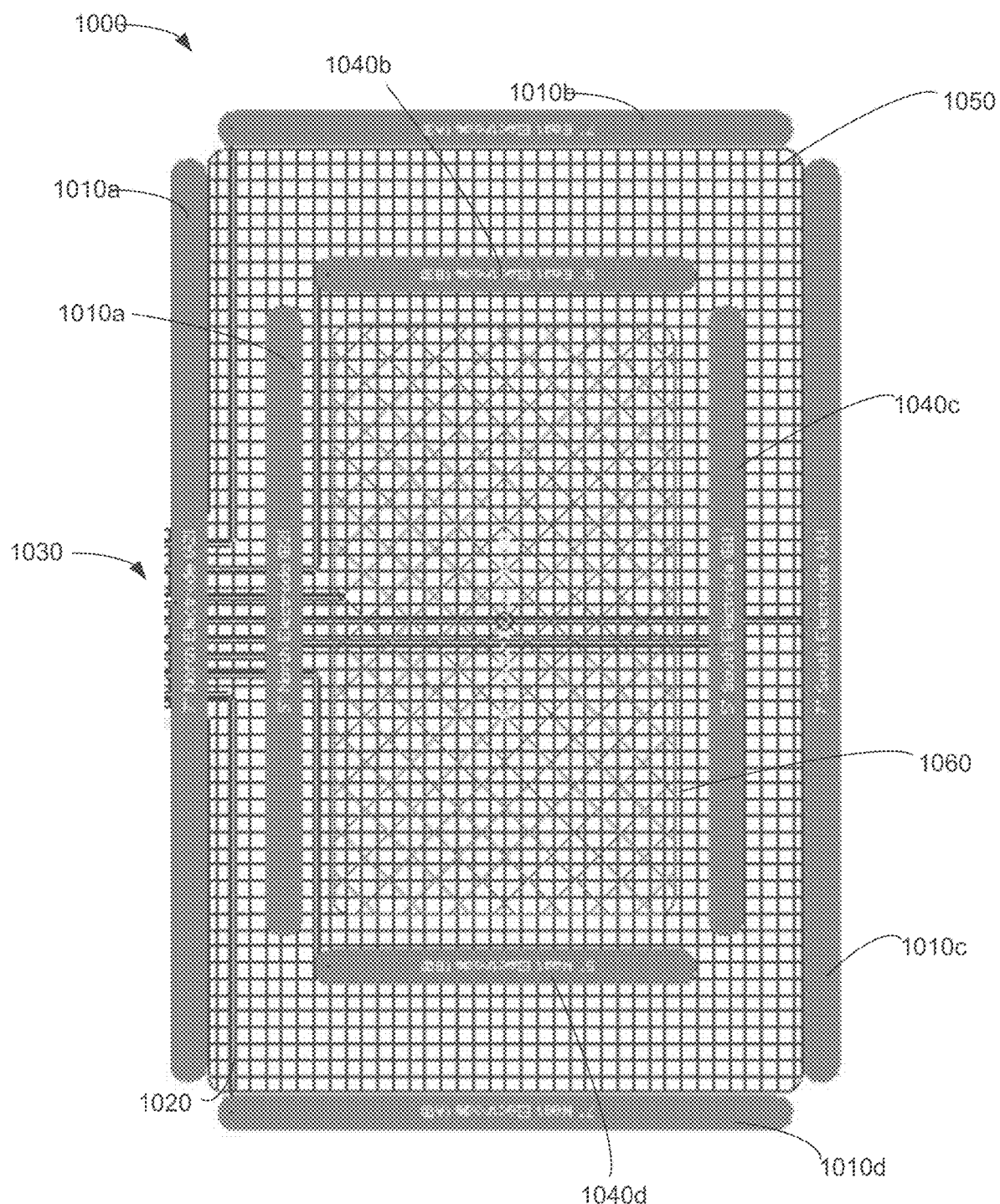
FIG. 10 shows another example of a sensor system according to various embodiments.

A textured electrode may have different shapes. A hash or hatch pattern may be used to texture an electrode. Thus, the terms "hash pattern" and "hatch pattern" are considered to be equivalent terms in this disclosure. The main aspect of texturing an electrode is to reduce the effective electrode area while not changing the size of the electrode. FIG. 10 shows examples of two textured electrodes 1050 and 1060 and will be discussed in more detail below. Thus, a grid of crossing connection lines may be used to form an electrode area as shown in FIG. 10. According to other embodiments, a plurality of parallel conductive stripes or conductive lines may be used as shown in FIG. 4. The lines may be all interconnected on one or both ends of the respective structure. In the embodiment shown in FIG. 5, the additional cut-out 520 might separate the various conducting lines if a striped pattern is chosen for the transmitting electrode 510. In such an embodiment, any electrically separated sections may be connected by additional feed lines or connected at the peripheral edge if possible. A textured electrode, for example when formed by a copper layer of a printed circuit board or a transparent TIN layer, for example in a display, basically removes a certain amount of copper or conductive material and thus reduces the capacitive coupling of such an electrode while the over-all size remains the same. Thus, a texture can be simply formed by a plurality of conductive lines. In one embodiment, these lines may cross each other, in other embodiments no crossing takes place and the lines are connected with each other in a peripheral area.

According to some embodiments, the receiving electrodes may also be textured electrodes. In some embodiment, only the transmitting electrodes are textured, in some embodiments, both, the receiving and the transmitting electrodes may be textured, and in some embodiments only the receiving electrodes are textured.

Figure 2:
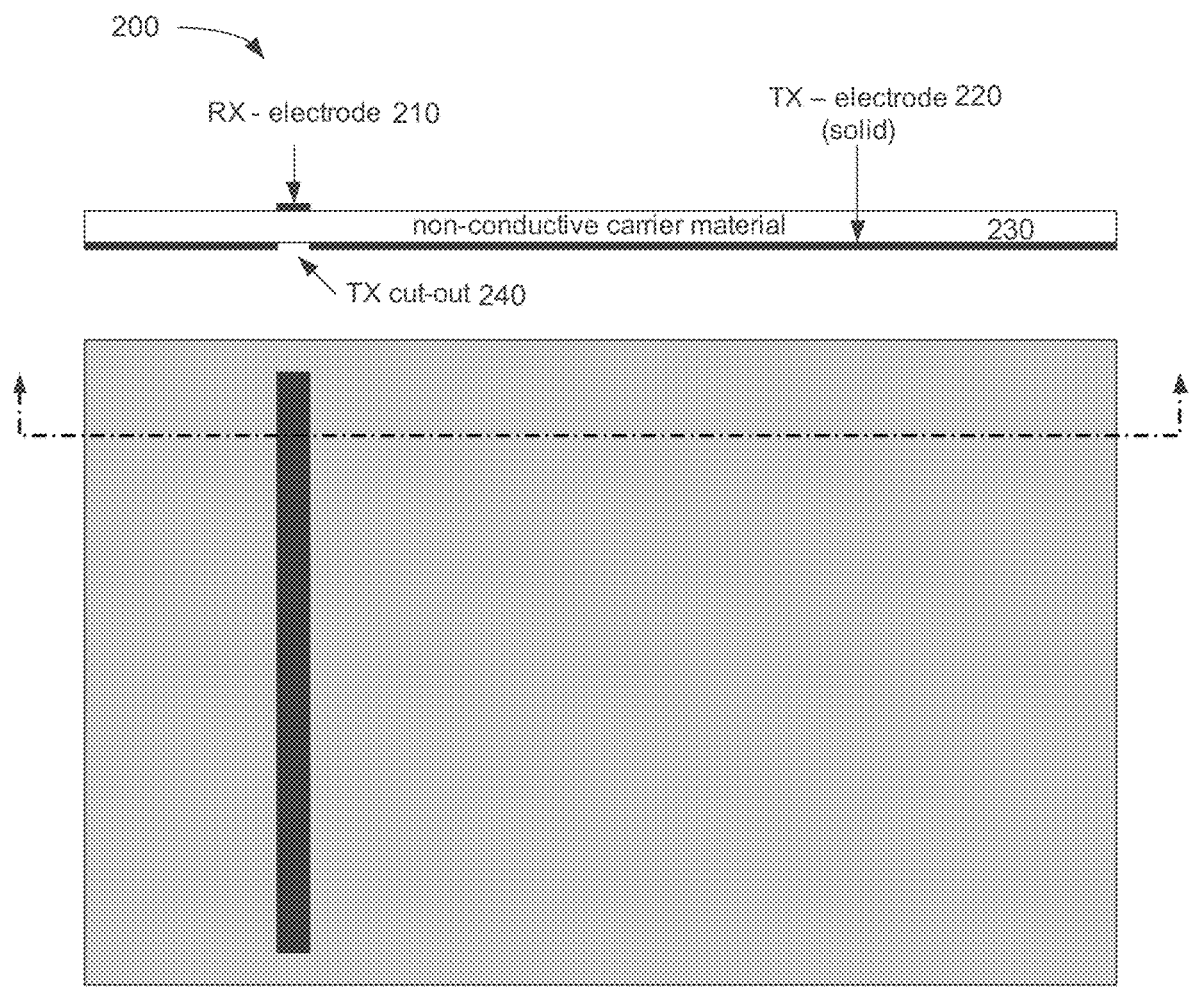
FIG. 2 shows a similar arrangement with a cutout Tx electrode area underneath an Rx electrode according to various embodiments.
Figure 5:
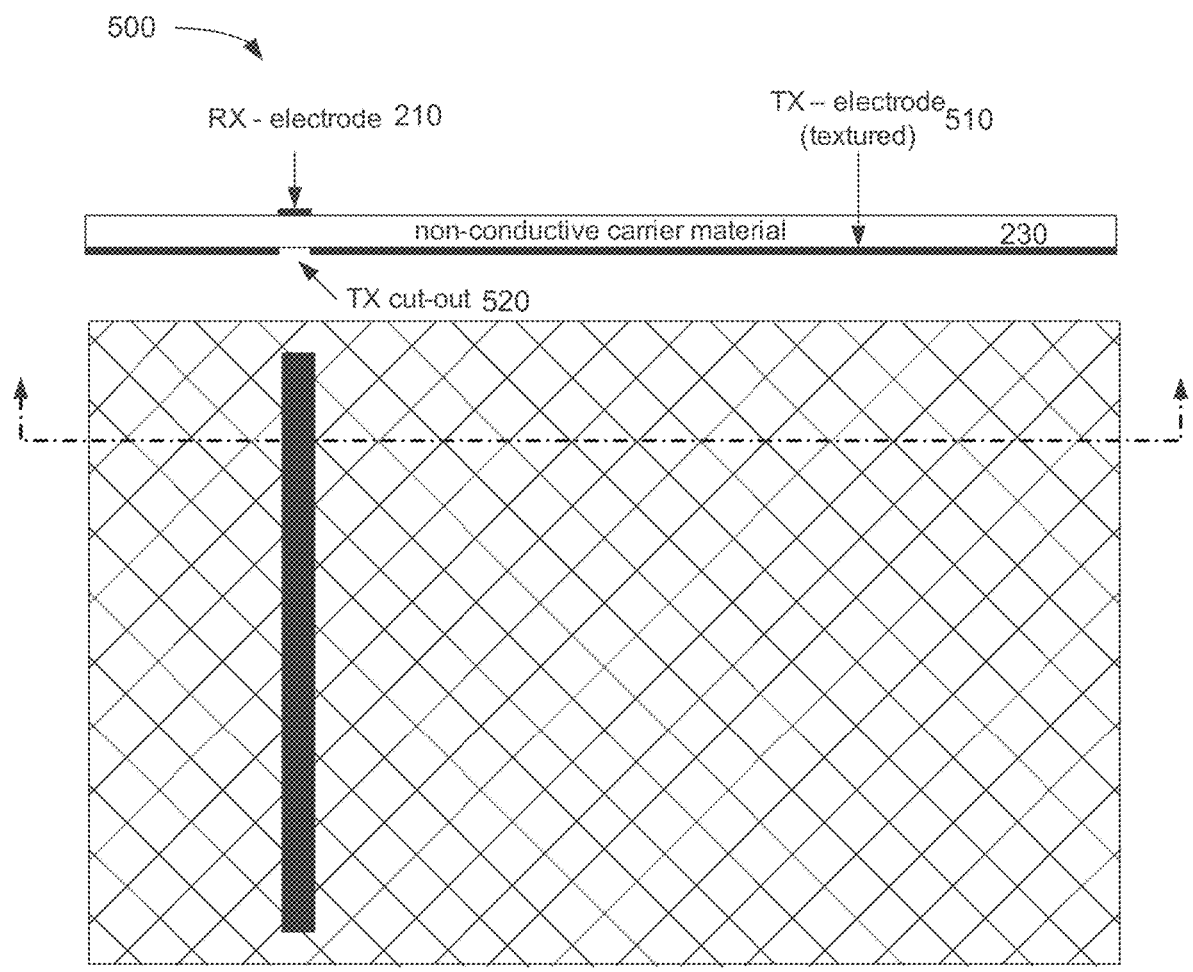
FIG. 5 shows a textured Tx electrode with Tx cutout underneath the Rx electrode according to an embodiment.

In order to emit an homogenous field it may be recommended to use a fine and homogenous texture, where the texture is connected to Tx. Solutions as shown in FIGS. 2, 3 and 4 can be combined as well. For example, FIG. 5 shows an embodiment 500 in which a textured transmission electrode 510 according to the embodiments of FIG. 3 or 4 further provides for a cut-out area 520 underneath the receiving electrode according to the embodiment of FIG. 2. As mentioned above, the cut-out area is used to further reduce the capacitive coupling and therefore does not need to match the area of the respective receiving electrode under which it is arranged. Alternatively to the cut-out area a hash or hatch pattern of different density compared to the texture of the remaining transmission electrode 510 can be used to balance the capacitances $(C_{RxTx}+C_L)$ and $(C_N+C_{RxG}+a\cdot C_{Buf})$. Thus, an area within the transmission electrode Tx below a receiving electrode may have, for example, a texture with thinner lines or less lines thereby reducing the capacitance between Tx and Rx electrodes.

Figure 8:
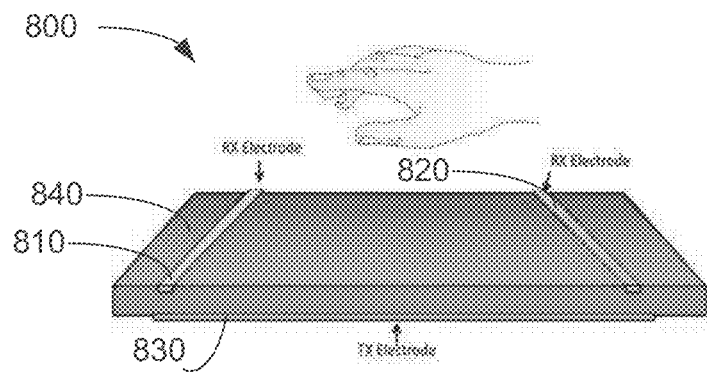
FIG. 8 shows a typical arrangement of transmitting and receiving electrodes in an electric field gesture detection system.

FIG. 8 shows a three-dimensional view of yet another example of an electrode arrangement 800 on a substrate 840. Here two Rx electrodes 810, 820 are shown which are elongated strips of conductive material, such as copper, arranged along or adjacent the border lines of the substrate. Again, the Tx electrode 830 may be textured according to the embodiments shown in FIGS. 3 and 4 and arranged on the backside of substrate 840.

Figure 9:
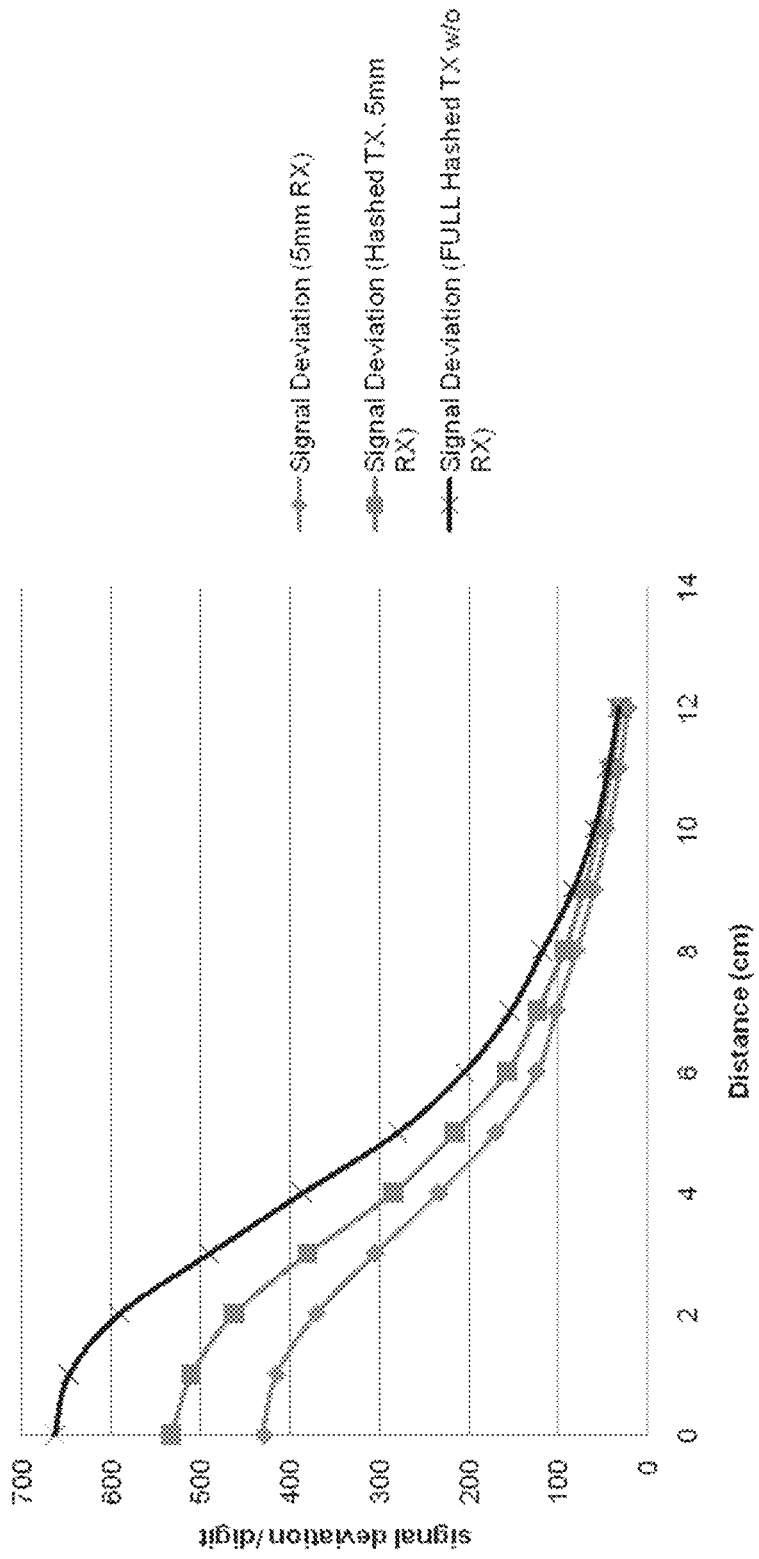
FIG. 9 shows signal deviation with optimized Tx structures according to various embodiments.

FIG. 9 shows signal deviation with optimized Tx structures according to various embodiments. As can be seen, the reduction of capacitance between the Tx and Rx electrodes yields to highly improved deviations and therefore better signal detection. The bottom curve shows the signal deviation of a conventional arrangement. The middle curve shows results for an arrangement with a hashed Tx electrode, for example according to FIG. 3. The top curve shows the effect of a combination of hashing and cut-out in the Tx electrode, for example according to FIG. 5.

FIG. 10 shows a top view of yet another embodiment of an electrode arrangement 1000. Here, the a first set of outer receiving electrodes 1010a, b, c, d are arranged on opposites sides on top of a printed circuit board, which may be designed to also comprise the entire front end circuitry, for example on the periphery of the board. A second set of receiving electrodes 1040, a, b, c, d may be arranged inside the area framed by the outer electrode set 1010, a, b, c, d. The second set of receiving electrodes 1040, a, b, c, d. can be spaced apart from the first set of electrodes 1010, a, b, c, d as shown in FIG. 10 wherein the distances of the horizontally (x-axis) arranged electrodes may be different from the vertically (y-axis) arranged electrodes. The center area can be filled with a specially designed center electrode 1060 which can be used to enhance the resolution of the z-coordinate perpendicular to the electrode area in close proximity. Furthermore the center electrode 1060 can be used as a touch electrode. In addition, the entire sensor arrangement may comprise an outer shielding ring (not shown in FIG. 10). In this embodiment, the center electrode 1060 is formed by a grid or mesh formed by conductive paths. All electrodes 1010, 1040 and 1060 on the top of the substrate can be formed by the top copper layer of the printed circuit board according to an embodiment. The printed circuit board may be a multi-layer board and feeding lines 1020 may connect to each electrode 1010, 1030, 1060 on the top layer through respective vias as known in the art of printed circuit board manufacturing. Thus, an area 1030 may be used as a general connection area from which a plurality of feed lines 1020 connect to the respective electrodes 101, 1040 and 1060. According to other embodiments, the inner second set of electrodes 1040 may be omitted and a respective larger center electrode 1060 may be formed accordingly. The number and arrangement of Rx electrodes 1010, 1040 is of course not limited to the arrangement shown in FIG. 10. Other configurations may apply.

The transmitting electrode 1050 can be formed on the backside of the printed circuit board or within an inner layer of a multi-layer printed circuit board and may be designed to have a grid pattern as shown in FIG. 10. Thus a plurality of square areas may be etched away to form the grid according to one embodiment. In other words, the grid is formed by a plurality of crossing vertical and horizontal conductive lines. Thus, the entire grid is interconnected and thus forms a single electrode. As shown in FIG. 10, transmitting electrode 1050 may consist of multiple section or in other words may be divided by the feeding lines 1020. Each section may have a peripheral conductive line that encompasses the entire section. Similarly center electrode 1060 shows such a peripheral conductive line that encompasses the entire center electrode 1060. Also, the mesh within the center electrode 1060 is not only wider spaced than the mesh of the transmitting electrode 1050 but also arranged at an angle with respect to the mesh formed by the transmitting electrode 1050. Other patterns are possible to form such a textured structures. For example, a structure similar to that used for the center electrode 1060 may be used. The center electrode 1060 may also be used as a shielding electrode which may receive a phase shifted signal derived from the main transmission signal fed to the transmitting electrode 1050. As shown in FIG. 10 and already mentioned above, the transmitting electrode 1050 does not overlap with the outer receiving electrodes 1010, a, b, c, d. Thus, the capacitive coupling between these receiving electrodes 1010, a, b, c, d and the transmitting electrode 1050 is further reduced. Here the cut-out area covers the entire external periphery defined by the four electrodes 1010a, b, c, d. However, a designed as proposed in FIG. 2 could also be used.

Figure 11:
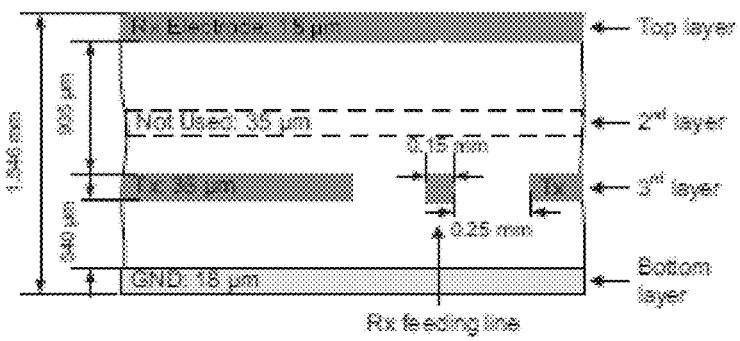
FIG. 11 shows a sectional view through a printed circuit board, for example, the circuit board shown in FIG. 10.

As mentioned above, the feeding connection lines could be formed within an inner layer of the printed circuit board. The transmission electrode can also be formed within an inner layer according to an embodiment. Thus, according to some embodiments, in a three layer printed circuit board, the transmission electrode and the feeding lines can be formed in an inner layer and the receiving electrodes can be formed in a top layer whereas a bottom layer may be used as a ground layer shielding both Tx and Rx electrodes. Multilayer printed circuit boards may be designed in a similar manner wherein additional layers in the electrode area may not be used, or only used for the feed lines. FIG. 11 shows an exemplary four layer printed circuit board with the Rx electrodes arranged within the top or first layer and the Tx electrode and feeding lines arranged within the third layer, wherein the fourth or bottom layer is used as a ground shielding layer. According to an embodiment, the second layer as shown in FIG. 11 may be omitted entirely. According to other embodiments, a simple two-sided circuit board may be used and the feed lines 1020 can be arranged on the bottom side. Any section separated by a feed line 1020 may be separately connected, for example in the area 1030.

Figure 12:
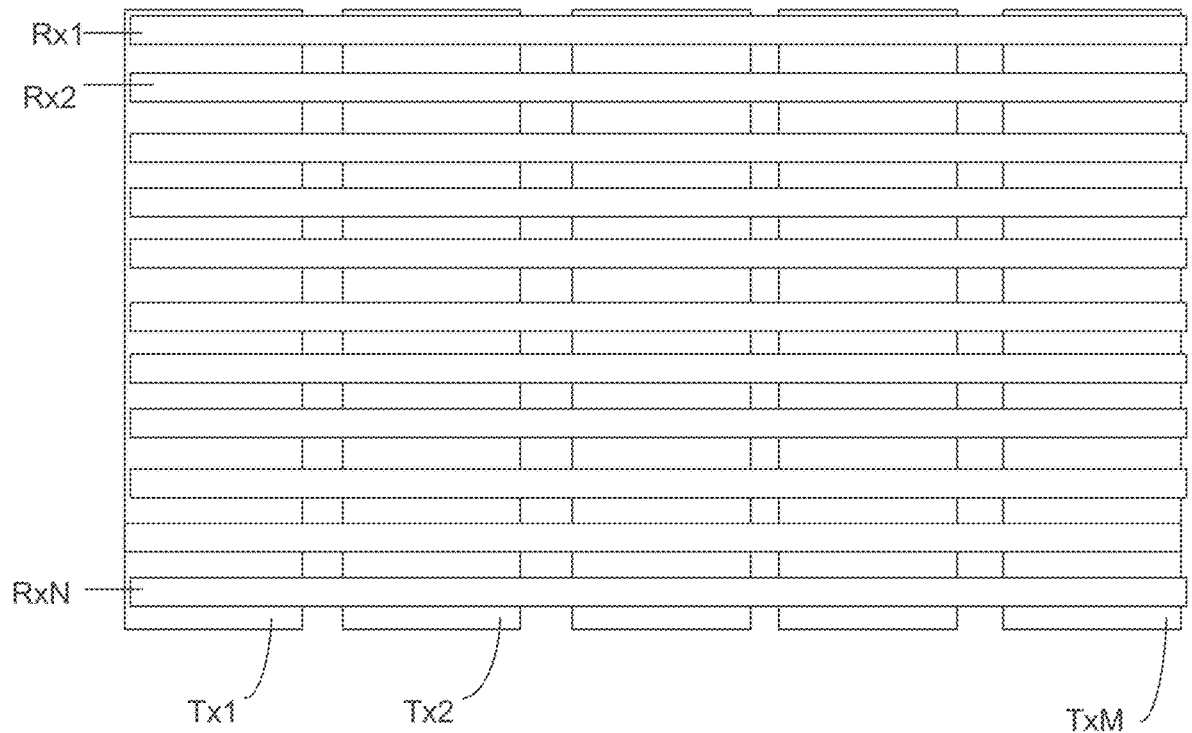
FIG. 12 shows a top view of yet another embodiment of an electrode arrangement.

FIG. 12 shows a top view of yet another embodiment in which multiple transmission electrodes Tx1, Tx2 . . . TxM are arranged underneath the receiving electrodes Rx1, Rx2 . . . RxN. Each transmission electrodes Tx1, Tx2 . . . TxM is electrically insulated from each other and, thus, the respective transmission electrodes Tx1, Tx2 . . . TxM can be controlled separately or one or more or even all transmission electrodes Tx1, Tx2 . . . TxM can be fed with the same transmission signal. Thus, instead of a single transmission electrode Tx a plurality of transmission electrodes Tx1, Tx2 . . . TxM may be arranged in parallel, for example, the transmission electrodes may be rectangular strips as shown in FIG. 12. However, other electrode forms may be used and the transmission electrodes may be arranged to form a homogenous texture or any other texture. Each transmission electrode Tx1, Tx2 . . . TxM may have the same shape as shown in FIG. 11. However, other embodiments may be used in which the transmission electrodes have different shapes and/or sizes. Such an arrangement may allow for a proximity and touch sensor system with improved spatial resolution. The transmission electrodes Tx1, Tx2 . . . TxM and/or receiving electrodes Rx1, Rx2 . . . RxN may also use a hash or hatch pattern as discussed above in particular to reduce the capacitance between the respective portions of the transmission and receiving electrodes that are most responsible for the capacitance between transmission and receiving electrodes.

1. Standard Electrode Equivalent Circuit

Figure 6:
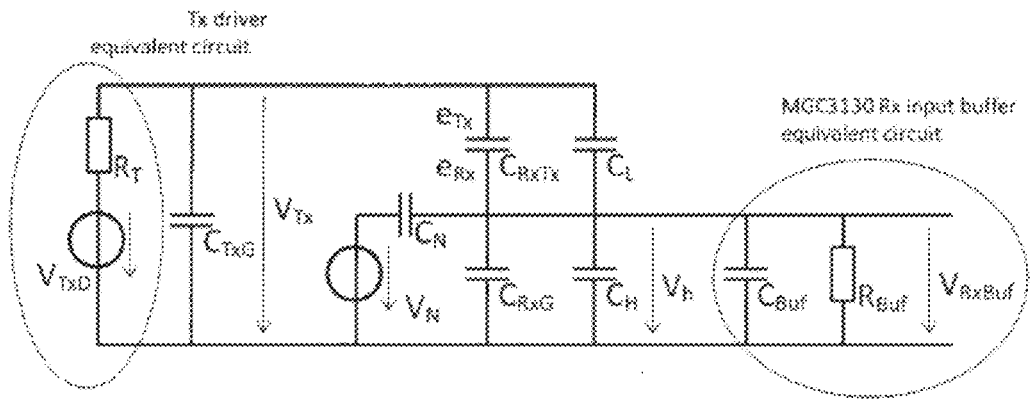
FIG. 6 shows a standard electrode equivalent circuit.

FIG. 6 shows a standard electrode equivalent circuit, with
$V_{TxD}$—the analog front end device voltage,
$V_{Tx}$—the transmitting electrode voltage,
$V_{RxBuf}$—the analog front end Rx buffer input voltage,
$V_h$—the auxiliary voltage to derive $V_{RxBuf}$
$V_N$—the external noise voltage to be injected to the receiving electrode $e_{Rx}$
$e_{Tx}$—the transmitting Tx electrode of the system
$e_{Rx}$—the receiving Rx electrode of the system
$C_{TxG}$—the capacitance between Tx electrode to ground
$C_{RxTx}$—the capacitance between Rx and Tx electrode
$C_L$—the Rx feeding capacitance to Tx
$C_{RxG}$—the capacitance between Rx electrode and ground
$C_H$—the capacitance between the hand and Rx
$C_{Buf}$—the input capacitance between the analog front end Rx input buffer
$R_T$—the analog front end Tx driver source resistance
$R_{Buf}$—the input resistance of the analog front end Rx input buffer The analog front end, for example the integrated circuit MGC3130 manufactured by Applicant, may have a low impedance output of $R_T$=800Ω and may be designed to drive load capacitances $C_{TxG}$ up to 1 nF. For such load capacitances it can be assumed that $V_{Tx}$=$V_{TxD}$.

2. Extended Electrode Equivalent Circuit

Figure 7:
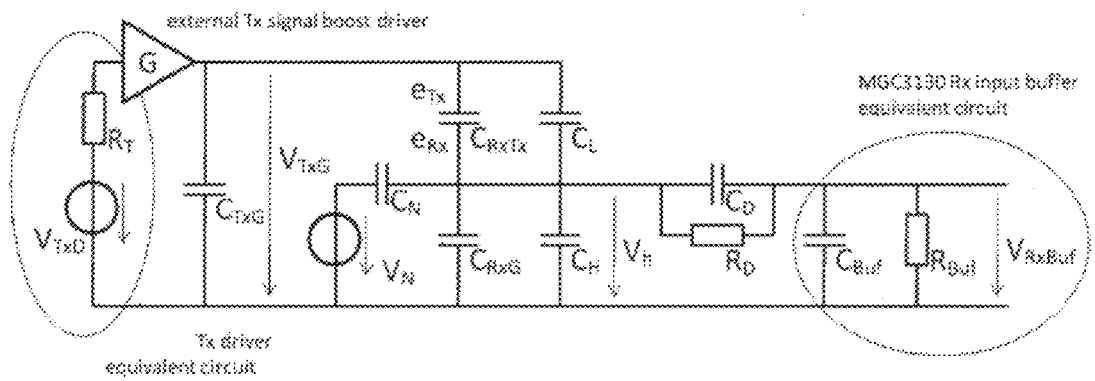
FIG. 7 shows an extended electrode equivalent circuit according to various embodiments.

FIG. 7 shows an extended electrode equivalent circuit according to various embodiments, with
$V_{TxD}$—the analog front end device voltage,
$V_{Tx}$—the transmitting electrode voltage,
$V_{RxBuf}$—the analog front end Rx buffer input voltage,
$V_h$—the auxiliary voltage to derive $V_{RxBuf}$
$V_N$—the external noise voltage to be injected to the receiving electrode $e_{Rx}$
$e_{Tx}$—the transmitting Tx electrode of the system
$e_{Rx}$—the receiving Rx electrode of the system
$C_{TxG}$—the capacitance between Tx electrode to ground
$C_{RxTx}$—the capacitance between Rx and Tx electrode
$C_L$—the Rx feeding capacitance to Tx $C_{RxG}$—the capacitance between Rx electrode and ground $C_H$—the capacitance between the hand and Rx $C_D$—the voltage divider capacitance $C_{Buf}$—the input capacitance between the analog front end Rx input buffer $R_D$—the voltage divider resistor for frequency compensation $R_{Buf}$—the input resistance of the analog front end Rx input buffer An external capacitance $C_D$ and resistor $R_D$ can be used to reduce the input voltage $V_{RxBuf}$ to a defined level that under high noise conditions the input buffer is not overloaded. The resistor $R_D$ is used to realize a frequency compensated voltage divider. The condition for this frequency divider (probe head circuit principle) is $$R_D \cdot C_D = R_{Buf} \cdot C_{Buf}$$

It may not be desirable to reduce the Tx output voltage of the chip. A best signal-to-noise ratios may be achieved with a maximum Tx signal, as shown below. Furthermore, an external Tx signal boost amplifier can be considered when required.

3. Receiver Input Signal

It can be assumed that the buffer input resistance has a much lower effect than the buffer input capacitance in the relevant frequency range of 30-200 kHz and for now it is assumed that $$R_{RxBuf} = R_D = \infty$$

$$(1) \quad V_{RxBuf} = V_h \cdot \frac{C_D}{C_{Buf} + C_D} = V_h \cdot a$$

wherein $a = C_D/(C_{Buf} + C_D)$ is the attenuation factor of the introduced voltage divider. In case no voltage divider is used $a=1$ and $C_D$ is replaced by a short circuit.

$$(2) \quad V_h = V_{Tx} \cdot \frac{1}{1 + \frac{C_N + C_{RxG} + a \cdot C_{Buf} + C_H}{C_{RxTx} + C_L}} + V_N \frac{1}{1 + \frac{C_{RxTx} + C_L + C_{RxG} + a \cdot C_{Buf} + C_H}{C_N}}$$

(3) = (2) in (1)

$$(4) \quad V_{RxBuf} = a \left[ \frac{V_{Tx}}{1 + \frac{C_N + C_{RxG} + a \cdot C_{Buf} + C_H}{C_{RxTx} + C_L}} + \frac{V_N}{1 + \frac{C_{RxTx} + C_L + C_{RxG} + a \cdot C_{Buf} + C_H}{C_N}} \right]$$

4. Receiver Signal Sensitivity

The receiver signal sensitivity regarding the hand influence is defined as the signal delta with and without the hand capacitance at noise free conditions ($V_N=0$)

$$(5) \quad \Delta S = V_{RxBuf} |_{C_H=0} - V_{RxBuf} |_{C_H=C_{Hand}}$$

$$(6) \quad \Delta S = V_{Tx} \cdot a \left[ \frac{1}{1 + \frac{C_N + C_{RxG} + a \cdot C_{Buf}}{C_{RxTx} + C_L}} - \frac{1}{1 + \frac{C_N + C_{RxG} + a \cdot C_{Buf} + C_{Hand}}{C_{RxTx} + C_L}} \right]$$

In a typical analog front end setup it can be assumed that the hand capacitance $C_{Hand}$ is much smaller than the Rx-Tx electrode capacitance C and equation (6) becomes $$(7) \quad \Delta S \approx V_{Tx} \cdot a \left[ \frac{C_{Hand}}{C_{RxTx} + C_L + 2(C_N + C_{RxG} + a \cdot C_{Buf}) + (C_N + C_{RxG} + a \cdot C_{Buf})^2 / (C_{RxTx} + C_L)} \right]$$

an application the following parameter are influencing factors:
 (a) the Rx feeding line capacitance $C_L$
 (b) the Rx electrode ground capacitance $C_{RxG}$ and
 (c) the capacitance between the Rx and the Tx electrode $C_{RxTx}$ (a) can be achieved by maximizing the distance of the Rx feeding lines to the Tx electrode and its feeding lines. Nevertheless, this is a tradeoff between shielding the Rx feeding line from hand influences which is recommended. Equation (7) shows it is better to shield the Rx feeding line with a Tx signal instead of ground. Ground shielding would increase $C_{RxG}$ which has a more negative impact on the system sensitivity than $C_L$ (see also equation (7)). It may be always a good idea to make the Rx feeding lines as thin as possible. This minimizes both the feeding line capacitance to Tx and to ground as well as the influence of the hand to the feeding line.

(b) can be achieved in general by maximizing the distance between the Rx-Tx electrode stack up and ground. Since ground parts typically cover large areas in a an analog front end system, e-field stray effects dominate typically $C_{RxG}$ and it often doesn't make sense to increase the Rx electrode distance to ground to more than a few millimeters.

(c) can be achieved by increasing the distance between the Rx and the Tx electrode. In a good analog front end electrode design $C_{RxTx}$ dominates the other capacitances. Thus, it is desirable to optimize $C_{RxTx}$ as discussed above, for example using cut-out areas 240, 520.

Other measures could be the structuring of the Tx electrode to lower its capacitance to Rx as shown in FIGS. 3 and 4. Structuring the Tx electrode means designing the Tx electrode for instance as a grid pattern instead of a completely filled conductive surface. This is done typically in keyboard designs. Nevertheless these measures may impact the shielding of an analog front end system against noise and increases the electrode ground capacitance $C_{RxG}$. Decreasing the area of the Rx electrode is another possibility. Furthermore it can be consider to structure the Rx electrode. Both has to be done well considered since the hand capacitance $C_{Hand}$ is also build between the Rx receive electrode and the hand and is a function of the Rx electrode design.

5. Signal Deviation

The signal deviation SD to the user's hand in an analog front end system is the receiver signal sensitivity amplified by the receiver gain $g_{PGA}$ and referenced to the analog voltage range of the chip of VDDA=3.0V. When $C_{Hand}$ is small compared to the Tx-Rx electrode capacitance $$(8) \quad S_D = a \cdot g_{PGA} \cdot V_{Tx} \frac{2^{15}}{3 \text{ V}} \left[ \frac{C_{Hand}}{C_{RxTx} + C_L + 2(C_N + C_{RxG} + a \cdot C_{Buf}) + (C_N + C_{RxG} + a \cdot C_{Buf})^2 / (C_{RxTx} + C_L)} \right]$$

6. Signal-to-Noise Ratio

The receiver input signal-to-noise ratio SNR is defined as the ratio between the signal and the noise term of equation (4)

$$(9) \quad SNR = \frac{V_{Tx}}{V_N} \cdot \frac{1 + \frac{C_{RxTx} + C_L + C_{RxG} + a \cdot C_{Buf} + C_H}{C_N}}{1 + \frac{C_N + C_{RxG} + a \cdot C_{Buf} + C_H}{C_{RxTx} + C_L}}$$

$$= \frac{V_{Tx}}{V_N} \cdot \frac{C_{RxTx} + C_L}{C_N}.$$

With it the SNR is independent from the attenuation factor a and the hand. At given coupling capacitances, it is desirable to work with the maximum possible Tx signal level VRx to maximize the SNR. Therefore at high noise level designs, e.g. in a LCD display application it is recommended to use an external Tx signal boost amplifier. The optional voltage divider is set to an attenuation factor a avoiding overloading the input channel under all noise conditions.

SNR can also be improved by reducing the noise coupling capacitance $C_N$ and thus lowering the received noise (second term in equation (4)) by increasing the effective distance of the receiving Rx electrode to the noise source (e.g. an DC/DC or a backlight converter). Typically a low impedance full surface Tx electrode shields effectively the receiving electrodes from noise sources inside a device.

7. Examples

In a first example no voltage divider is used and optimum capacitive values are chosen. The transmit voltage level is set to 2 Vpp in order to avoid an overload of the input buffer under all noise conditions:

$V_{Tx}$=2 $V_{pp}$
$V_N$=3 $V_{rms}$=8.5 $V_{pp}$
a=1
$C_{RxTx}$=15 pF
$C_L$=5 pF
$C_{RxG}$=7 pF
$C_H$=0.5 pF
$C_N$=1 pF
$C_{Buf}$=5 pF The buffer signal without noise is with first term of equation (4)

$$V_{RxBuf} = V_{Tx} \cdot \frac{1}{1 + \frac{C_N + C_{RxG} + C_{Buf} + C_H}{C_{RxTx} + C_L}}$$

$$V_{RxBuf} = 2 \ Vpp \cdot \frac{1}{1 + \frac{1 \text{ pF} + 7 \text{ pF} + 5 \text{ pF} + 1 \text{ pF}}{15 \text{ pF} + 5 \text{ pF}}} = 1.176 \ Vpp$$

The signal delta becomes $$\Delta S = 2 \ V_{pp} \left[ \frac{0.5 \text{ pF}}{15 \text{ pF} + 5 \text{ pF} + 2(1 \text{ pF} + 7 \text{ pF} + 5 \text{ pF}) + (1 \text{ pF} + 7 \text{ pF} + 5 \text{ pF})^2 / (15 \text{ pF} + 5 \text{ pF})} \right]$$

$$\Delta S = 2 \ V_{pp} \cdot 0.00918 = 18.37 \text{ mV}$$

The digital signal deviation SD at the output of the CIC filter is at $G_{PGA}$=10

$$S_D = G_{PGA} \cdot \Delta S \cdot \frac{2^{15}}{3 \text{ V}} = 2006 \ LSB$$

The SNR becomes $$SNR = \frac{2 \ V_{pp}}{8.5 \ V_{pp}} \cdot \frac{15 \text{ pF} + 5 \text{ pF}}{1 \text{ pF}} = 4.706 \equiv 13.45 \text{ dB}$$

In a second example an 2:3 voltage divider is used and same optimum capacitive values as above are chosen. The transmit voltage level is set to the maximum output level of the analog front end device.

$V_{Tx}$=3 $V_{pp}$
$V_N$=3 $V_{rms}$=8.5 $V_{pp}$
a=0.666
$C_{RxTx}$=15 pF
$C_L$=5 pF
$C_{RxG}$=7 pF
$C_H$=0.5 pF
$C_N$=1 pF
$C_{Buf}$=5 pF
$C_D$=10 pF The buffer signal without noise is with the first term of equation (4)

$$V_{RxBuf} = a \cdot \frac{V_{Tx}}{1 + \frac{C_N + C_{RxG} + a \cdot C_{Buf} + C_H}{C_{RxTx} + C_L}}$$

$$V_{RxBuf} = 2 \ Vpp \cdot \frac{1}{1 + \frac{1 \text{ pF} + 7 \text{ pF} + 3.3 \text{ pF} + 0.5 \text{ pF}}{15 \text{ pF} + 5 \text{ pF}}} = 1.258 \ Vpp$$

The signal delta becomes $$\Delta S =$$

$$3 \ V_{pp} \cdot a \left[ \frac{0.5 \text{ pF}}{15 \text{ pF} + 5 \text{ pF} + 2(1 \text{ pF} + 7 \text{ pF} + 3.3 \text{ pF}) + (1 \text{ pF} + 7 \text{ pF} + 3.3 \text{ pF})^2 / (15 \text{ pF} + 5 \text{ pF})} \right]$$

$$\Delta S = 3 \ V_{pp} \cdot \frac{2}{3} \cdot 0.01019 = 20.4 \text{ mV}$$

The digital signal deviation SD at the output of the CIC filter is at $G_{PGA}=10$ $$S_D = G_{PGA} \cdot \Delta S \cdot \frac{2^{15}}{3\text{ V}} = 2228 \text{ LSB}$$

The SNR becomes $$SNR = \frac{3\ V_{pp}}{8.5\ V_{pp}} \cdot \frac{15\text{ pF} + 5\text{ pF}}{1\text{ pF}} = 7.059 \equiv 16.97\text{ dB}$$

The second example demonstrates that with about the same signal levels at the receiver input, the SNR is improved by about 3.5 dB as expected. The signal deviation produced by the hand is 11% higher than in example 1.

In a third example no voltage divider is used and typical capacitive values are chosen. The transmit voltage level is set to 2 Vpp:

$V_{Tx}=2V_p p$
$V_N=3\ V_{rms}=8.5\ V_{pp}$
$a=1$
$C_{RxTx}=20$ pF
$C_L=10$ pF
$C_{RxG}=15$ pF
$C_H=0.5$ pF
$C_N=1$ pF
$C_{buf}=5$ pF The buffer signal without noise is with the first term of equation (4)

$$V_{RxBuf} = V_{Tx} \cdot \frac{1}{1 + \frac{C_N + C_{RxG} + C_{Buf} + C_H}{C_{RxTx} + C_L}}$$

$$V_{RxBuf} = 2\ Vpp \cdot \frac{1}{1 + \frac{1\text{ pF} + 15\text{ pF} + 5\text{ pF} + 0.5\text{ pF}}{20\text{ pF} + 10\text{ pF}}} = 1.165\ Vpp$$

The signal becomes $$\Delta S = 2\ V_{pp} \left[ \frac{0.5\text{ pF}}{20\text{ pF} + 10\text{ pF} + 2(1\text{ pF} + 15\text{ pF} + 5\text{ pF}) + (1\text{ pF} + 15\text{ pF} + 5\text{ pF})^2 / (20\text{ pF} + 10\text{ pF})} \right]$$

$$\Delta S = 2\ V_{pp} \cdot 0.00577 = 11.53\text{ mV}$$

The digital signal deviation SD at the output of the CIC filter is at $G_{PGA}=10$ $$S_D = G_{PGA} \cdot \Delta S \cdot \frac{2^{15}}{3\text{ V}} = 1259\text{ LSB}$$

The SNR becomes $$SNR = \frac{2\ V_{pp}}{8.5\ V_{pp}} \cdot \frac{20\text{ pF} + 10\text{ pF}}{1\text{ pF}} = 7.059 \equiv 16.97\text{ dB}$$

In the third example again the received signal level at the Rx input buffer is similar to the previous examples. The SNR is the same compared to the second example where a higher Tx transmit voltage was used. The higher Rx-Tx electrode coupling shields in this example the noise. Nevertheless the sensitivity to the hand is 37% and 43% lower compared to the first and second example, respectively.

For maximum range it is desirable to choose an electrode design with maximum signal deviation to the hand and to use a boost amplifier to address external noise when required. The gain of the boost amplifier should typically not exceed more than 6, to allow a voltage divider capacitance above 1 pF.

What is claimed is:

1. An electrode arrangement for an electric field sensor device, comprising:
a non conductive substrate having a first conductive layer arranged on a first side of the nonconductive substrate and a second conductive layer arranged on a second side of the nonconductive substrate opposite of said first side,
a plurality of receiving electrodes comprising a first set of four receiving electrodes arranged within the first conductive layer such that the four receiving electrodes form a first frame, and
a plurality of electrically insulated transmitting electrodes arranged within the second conductive layer, wherein to generate a quasi-static electric field the electrode arrangement is configured to feed an alternating signal having a frequency of 30-200 kHz to one of the electrically insulated transmitting electrodes in a first mode and in a second mode to feed the same alternating signal having a frequency of 30-200 kHz to the plurality of electrically insulated transmitting electrodes to improve a spatial resolution of the electrode arrangement.

2. The electrode arrangement according to claim 1, wherein a surface area of the electrically insulated transmitting electrodes and/or the receiving electrodes are textured by a hash or hatched texture.

3. The electrode arrangement according to claim 1, wherein the entire area of each the electrically insulated transmitting electrode is textured.

4. The electrode arrangement according to claim 3, wherein the hatched texture forms a grid.

5. The electrode arrangement according to claim 4, wherein the texture is homogenous.

6. The electrode arrangement according to claim 4, wherein the hash or hatched texture is formed by a plurality of conductive lines forming a mesh.

7. The electrode arrangement according to claim 6, wherein the mesh is formed by a first set of parallel arranged conductive lines and a second set of parallel arranged conductive lines.

8. The electrode arrangement according to claim 7, wherein the first set of parallel arranged conductive lines crosses said second set of parallel arranged conductive lines at an angle of 90 degrees.

9. The electrode arrangement according to claim 7, wherein the mesh comprises a peripheral conductive line enclosing the mesh.

10. The electrode arrangement according to claim 1, wherein the receiving electrodes are strip shaped and arranged in parallel.

11. The electrode arrangement according to claim 1, wherein the electrically insulated transmitting electrodes are strip shaped and arranged in parallel.

12. The electrode arrangement according to claim 1, wherein the receiving electrodes are strip shaped and arranged in parallel and the electrically insulated transmitting electrodes are strip shaped and arranged in parallel and perpendicular to said receiving electrodes and wherein a width of each electrically insulated transmitting electrode is wider than a width of a receiving electrode.

13. The electrode arrangement according to claim 1, further comprising a plurality of feeding lines formed in said first conductive layer for electrical connection to said plurality of receiving electrodes.

14. The electrode arrangement according to claim 13, further comprising a front end analog device coupled with said receiving electrodes through said feeding lines.

15. The electrode arrangement according to claim 14, wherein the front end analog device comprises a voltage divider for attenuating a signal received through said feeding lines.

16. The electrode arrangement according to claim 15, wherein the voltage divider comprises a frequency compensation.

17. The electrode arrangement according to claim 1, wherein the first conductive layer is a top layer of a printed circuit board and wherein the second conductive layer is a bottom layer of a printed circuit board.

18. A printed circuit board comprising an electrode arrangement for an electric field sensor device, comprising:
a non conductive substrate having a first conductive layer arranged on a first side of the nonconductive substrate and a second conductive layer arranged on a second side of the nonconductive substrate opposite of said first side,
a plurality of receiving electrodes comprising a first set of four receiving electrodes arranged within the first conductive layer such that the four receiving electrodes form a first frame, and
a plurality of electrically insulated transmitting electrodes arranged within the second conductive layer, wherein a surface area of each electrically insulated transmitting electrode is textured, and wherein to generate a quasi-static electric field the electrode arrangement is configured in a first mode to feed an alternating signal having a frequency of 30-200 kHz to one of the electrically insulated transmitting electrodes and in a second mode to feed the same alternating signal having a frequency of 30-200 kHz to the plurality of electrically insulated transmitting electrodes to improve a spatial resolution of tire electrode arrangement.

19. A printed circuit board comprising an electrode arrangement for an electric field sensor device, comprising:
a nonconductive substrate having a first conductive layer arranged on a first side of the nonconductive substrate and a second conductive layer arranged on a second side of the nonconductive substrate opposite of said first side,
a plurality of receiving electrodes comprising a first set of four receiving electrodes arranged within the first conductive layer such that the four receiving electrodes form a first frame, and
a plurality of electrically insulated transmitting electrodes arranged within the second conductive layer, wherein a surface area of each electrically insulated transmitting electrode is textured by a hash or hatched texture, wherein the hash or hatched texture is formed by a plurality of conductive lines forming a mesh, wherein the mesh comprises a peripheral conductive line enclosing the mesh, wherein to generate a quasi-static electric field the electrode arrangement is configured in a first mode to feed an alternating signal having a frequency of 30-200 kHz to one of the electrically insulated transmitting electrodes and in a second mode to feed the same alternating signal having a frequency of 30-200 kHz to the plurality of electrically insulated transmitting electrodes to improve a spatial resolution of the electrode arrangement.

20. The printed circuit board according to claim 10, wherein the mesh is formed by a first set of parallel arranged conductive lines and a second set of parallel arranged conductive lines, wherein the first set of parallel arranged conductive lines crosses said second set of parallel arranged conductive lines at an angle of 90 degrees.

21. The printed circuit board according to claim 19, wherein the receiving electrodes are strip shaped and arranged in parallel.

22. The printed circuit board according to claim 21, wherein the electrically insulated transmitting electrodes are strip shaped and arranged in parallel perpendicular to said receiving electrodes.

* * * * *